(12) United States Patent
Ikeda et al.

(10) Patent No.: US 11,089,674 B2
(45) Date of Patent: Aug. 10, 2021

(54) WIRING SUBSTRATE AND METHOD FOR MANUFACTURING WIRING SUBSTRATE

(71) Applicant: IBIDEN CO., LTD., Ogaki (JP)

(72) Inventors: Tomoyuki Ikeda, Ogaki (JP); Shigemitsu Kunikane, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/892,800

(22) Filed: Jun. 4, 2020

(65) Prior Publication Data

US 2020/0389969 A1 Dec. 10, 2020

(30) Foreign Application Priority Data

Jun. 7, 2019 (JP) .............................. JP2019-107145

(51) Int. Cl.
*H05K 1/02* (2006.01)
*H05K 1/11* (2006.01)
(Continued)

(52) U.S. Cl.
CPC ............. *H05K 1/025* (2013.01); *H05K 1/024* (2013.01); *H05K 1/0219* (2013.01); *H05K 1/0242* (2013.01); *H05K 1/115* (2013.01); *H05K 3/108* (2013.01); *H05K 3/18* (2013.01); *H05K 3/4673* (2013.01); *H05K 1/0298* (2013.01); *H05K 1/11* (2013.01); *H05K 3/4661* (2013.01); *H05K 2201/0391* (2013.01); *H05K 2201/096* (2013.01)

(58) Field of Classification Search
CPC ...... H05K 1/025; H05K 3/108; H05K 1/0242; H05K 1/115; H05K 1/0219; H05K 3/18; H05K 3/4673; H05K 1/024
See application file for complete search history.

(56) References Cited

U.S. PATENT DOCUMENTS

2013/0075140 A1* 3/2013 Amano ................ H05K 3/4602
174/257
2015/0107884 A1* 4/2015 Inoue ................... H05K 1/0298
174/257
(Continued)

FOREIGN PATENT DOCUMENTS

JP 2006-049645 A 2/2006

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a substrate including conductor layers and core insulating layers, and a laminate including insulating layers and conductor layers such that the conductor layers include first layer including first line pattern. The laminate includes first strip line including the first pattern, a pair of interlayer insulating layers sandwiching the first pattern, and a pair of conductor layers sandwiching the interlayer layers, the conductor layers in the substrate include second layer including second line pattern such that the substrate includes second strip line including the second pattern, a pair of core insulating layers sandwiching the second pattern, and a pair of conductor layers sandwiching the core insulating layers, and the pair of core insulating layers is thicker than the pair of interlayer layers, the second pattern is thicker than the first pattern, and line width of the second pattern is larger than line width of the first pattern.

20 Claims, 7 Drawing Sheets

(51) Int. Cl.
*H05K 3/46* (2006.01)
*H05K 3/10* (2006.01)
*H05K 3/18* (2006.01)

(56) References Cited

U.S. PATENT DOCUMENTS

2015/0327363 A1* 11/2015 Inagaki .................. H05K 1/181
                                                    174/251
2017/0187087 A1*  6/2017 Baba .................... H05K 1/0245

* cited by examiner

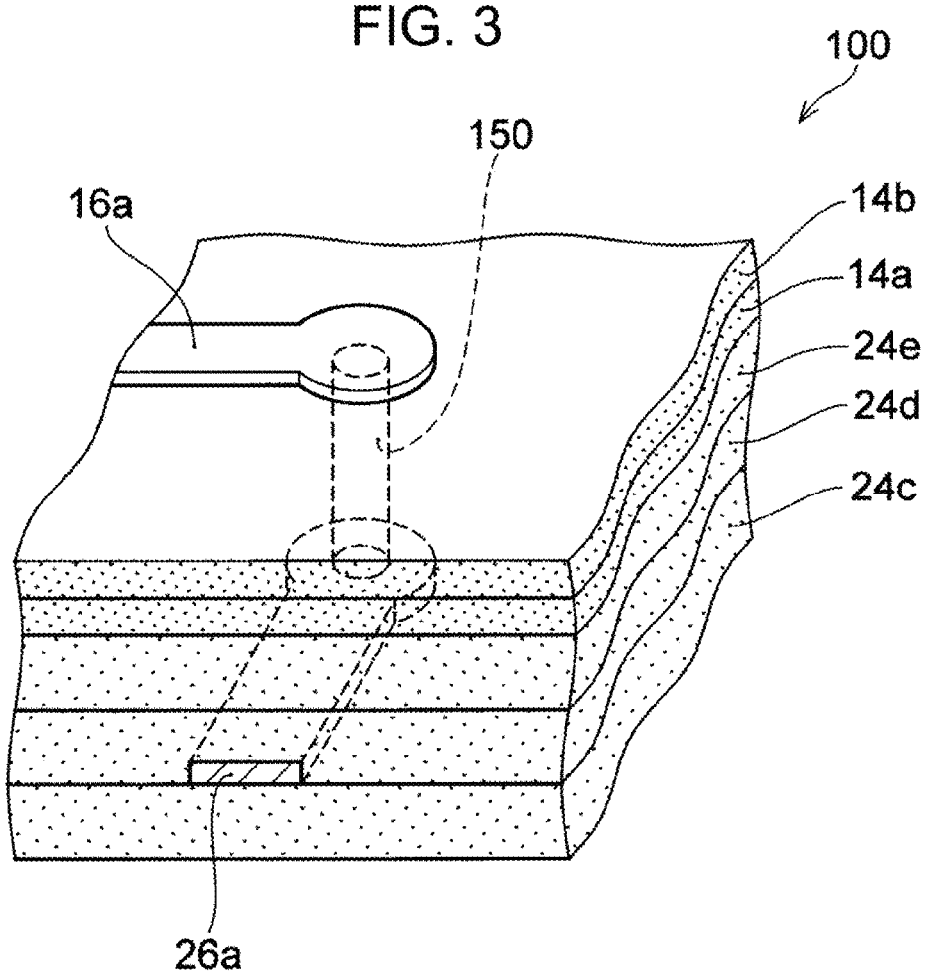

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2019-107145, filed Jun. 7, 2019, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Laid-Open Publication No. 2006-49645 describes a wiring substrate that includes a power source layer on a conductor layer on one side of a core substrate and a ground layer in a conductor layer on the other side of the core substrate, and includes a micro strip line pattern in a conductor layer built up on the core substrate. The entire contents of this publication are incorporated herein by reference.

SUMMARY OF THE INVENTION

According to one aspect of the present invention, a wiring substrate includes a core substrate including conductor layers and intra core substrate insulating layers interposed between the conductor layers respectively, and a laminate formed on a first surface of the core substrate and including insulating layers and conductor layers such that the conductor layers in the laminate include a first conductor layer including a first line pattern. The laminate includes a first strip line including the first line pattern, a pair of interlayer insulating layers sandwiching the first line pattern, and a pair of conductor layers sandwiching the pair of interlayer insulating layers, the conductor layers in the core substrate include a second conductor layer including a second line pattern such that the core substrate includes a second strip line including the second line pattern, a pair of the intra core substrate insulating layers sandwiching the second line pattern, and a pair of conductor layers sandwiching the pair of the intra core substrate insulating layers, and the core substrate and the laminate are formed such that a thickness of the pair of the intra core substrate insulating layers is larger than a thickness of the pair of interlayer insulating layers, that a thickness of the second line pattern is larger than a thickness of the first line pattern, and that a line width of the second line pattern is larger than a line width of the first line pattern.

According to another aspect of the present invention, a method for manufacturing a wiring substrate includes forming a core substrate including insulating layers and conductor layers such that each of the conductor layers includes a metal foil, and forming a laminate including insulating layers and conductor layers on the a first surface of the core substrate such that each of the conductor layers in the laminate does not include a metal foil. The forming of the laminate includes forming a first strip line on the first surface of the core substrate, the forming of the first strip line includes forming a first line pattern for forming a signal transmission path of the first strip line by an additive method without using a metal foil, the forming of the core substrate includes forming a second strip line in the core substrate, and the forming of the second strip line includes forming a second line pattern for forming a signal transmission path of the second strip line by a subtractive method with using a metal foil or a semi-additive method with using a metal foil.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a perspective view conceptually illustrating connection between first and second line patterns in the wiring substrate of the embodiment;

DETAILED DESCRIPTION OF THE EMBODIMENTS

Figure 1:
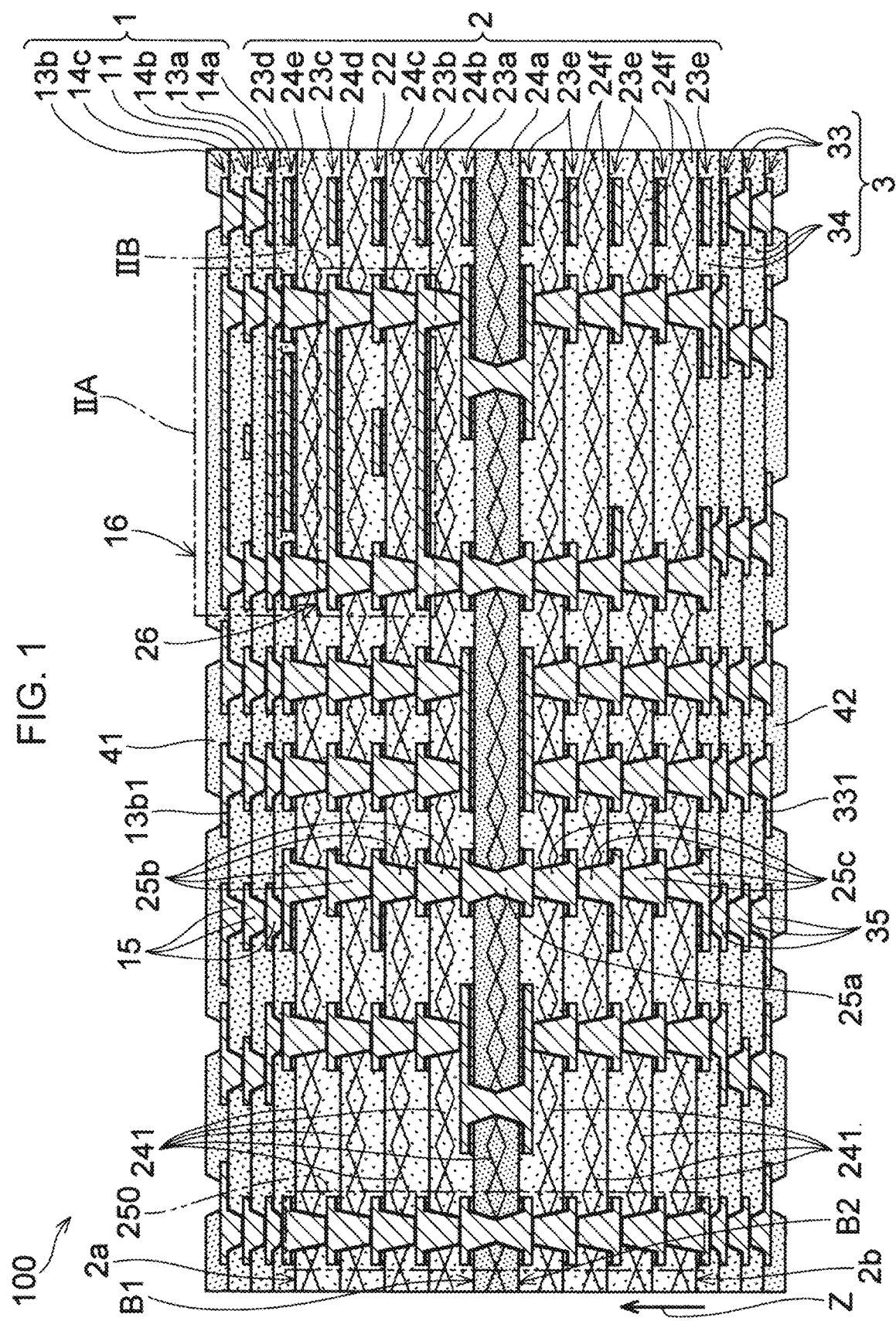
FIG. 1 is a cross-sectional view illustrating an example of a wiring substrate of an embodiment of the present invention.

Embodiments will now be described with reference to the accompanying drawings, wherein like reference numerals designate corresponding or identical elements throughout the various drawings.

A wiring substrate of an embodiment of the present invention is described with reference to the drawings. FIG. 1 illustrates a cross-sectional view of a wiring substrate 100 which is an example of the wiring substrate of the embodiment. Further, FIGS. 2A and 2B respectively illustrate enlarged views of a portion (IIA) and a portion (IIB) of FIG. 1.

As illustrated in FIG. 1, the wiring substrate 100 includes: a core substrate 2 having a first surface (2a) and a second surface (2b) on an opposite side with respect to the first surface (2a); a first laminate 1 formed on the first surface (2a); and second laminate 3 formed on the second surface (2b). The core substrate 2 is formed to include: multiple conductor layers including a second conductor layer 22 (in the example of FIG. 1, the second conductor layer 22 and conductor layers (23a-23e)); and intra core substrate insulating layers (in the example of FIG. 1, intra core substrate insulating layers (24a-24f)) respectively interposed between the multiple conductor layers. In the example of FIG. 1, the intra core substrate insulating layer (24a) is a base insulating layer formed of an insulating substrate used as a starting substrate in the formation of the core substrate 2. The first and second laminates (1, 3) each include alternately laminated insulating layers and conductor layers. specifically, the first laminate 1 includes multiple conductor layers including a first conductor layer 1 (in the example of FIG. 1, the first conductor layer 11, a conductor layer (13a) and a conductor layer (13b)), and multiple interlayer insulating layers (in the example of FIG. 1, interlayer insulating layers (14a-14c)). The second laminate 3 includes three conductor layers 33 and three interlayer insulating layers 34 in the example of FIG. 1. The first and second laminates (1, 3) are respectively build-up layers formed on the first surface (2a) and the second surface (2b) of the core substrate 2 in the wiring substrate 100. In the wiring substrate 100, as described below, the conductor layers such as the second conductor layer 22 and the intra core substrate insulating layers in the core substrate 2 are also formed on both sides of the intra core substrate insulating layer (24a) using a build-up manufacturing method.

In the description of the wiring substrate 100, a side farther from the intra core substrate insulating layer (24a) in a thickness direction of the wiring substrate 100 is also referred to as an "upper side" or simply "upper," and a side closer to the intra core substrate insulating layer (24a) is also referred to as a "lower side" or simply "lower." Further, for the conductor layers and the insulating layers, a surface facing an opposite side with respect to the intra core substrate insulating layer (24a) is also referred to as an "upper surface," and a surface facing the intra core substrate insulating layer (24a) side is also referred to as a "lower surface." Therefore, in the description of the first laminate 1 and the second laminate 3, a side farther from the core substrate 2 is also referred to as an "upper side" or simply "upper," and a side closer to the core substrate 2 is also referred to as a "lower side" or simply "lower." Further, the thickness direction of the wiring substrate 100 is also simply referred to as a "Z direction."

As illustrated in FIG. 1, the base insulating layer (intra core substrate insulating layer (24a)) has a first base surface (B1) on the first surface (2a) side of the core substrate 2 and a second base surface (B2) on an opposite side with respect to the first base surface (B1). On the first base surface (B1), the conductor layer (23a), the intra core substrate insulating layer (24b), the conductor layer (23b), the intra core substrate insulating layer (24c), the second conductor layer 22, the intra core substrate insulating layer (24d), the conductor layer (23c), intra core substrate insulating layer (24e), and the conductor layer (23d) are laminated in this order. On the second base surface (B2), the five conductor layers (23e) are formed, and the intra core substrate insulating layers (24f) are respectively interposed between the five conductor layers (23e). Upper surfaces of the intra core substrate insulating layer (24e) and the conductor layer (23d) form the first surface (2a). Upper surfaces of the conductor layer and the intra core substrate insulating layer that are respectively farthest from the intra core substrate insulating layer (24a) among the conductor layers (23e) and the intra core substrate insulating layers (24f) form the second surface (2b).

On the first surface (2a) of the core substrate 2, the interlayer insulating layer (14a), the conductor layer (13a), the interlayer insulating layer (14b), the first conductor layer 11, the interlayer insulating layer (14c), and the conductor layer (13b) are laminated in this order, and the first laminate 1 is formed by these conductor layers and insulating layers. The conductor layer (13b) includes connection pads (13b1) used for mounting an external electronic component (not illustrated in the drawings). A solder resist layer 41 is formed on the first laminate 1. The solder resist layer 41 has openings exposing the connection pads (13b1).

On the second surface (2b) of the core substrate 2, the insulating layers 34 and the conductor layers 33 are alternately laminated, and the second laminate 3 including the three insulating layers 34 and the three conductor layers 33 is formed. The conductor layer 33 that is farthest from the core substrate 2 includes connection pads 331 used for connecting to an external wiring substrate or an external component. A solder resist layer 42 is formed on the second laminate 3. The solder resist layer 42 has openings exposing the connection pads 331. A surface protective film (not illustrated in the drawings) formed of Au, Ni/Au, Ni/Pd/Au, solder, heat resistant preflux, or the like may be formed on an exposed surface of each of the connection pads (13b1) and the connection pads 331.

The solder resist layers (41, 42) can be formed using any insulating material. The solder resist layers (41, 42) are formed by using, for example, a photosensitive resin containing an epoxy resin, a polyimide resin or the like as a main raw material.

The insulating layers of the wiring substrate 100 include via conductors 15, via conductors (25b), via conductors (25c), via conductors 35, or through-hole conductors (25a). The via conductors 15 are included in the interlayer insulating layers (14a-14c) in the first laminate 1, and the via conductors 35 are included in the interlayer insulating layers 34 in the second laminate 3. The via conductors (25b) are included in the intra core substrate insulating layers (24b-24e), the via conductors (25c) are included in the intra core substrate insulating layer (24f), and the through-hole conductors (25a) are included in the base insulating layer (intra core substrate insulating layer (24a)). Each of the via conductors or the through-hole conductors (25a) penetrates an insulating layer that includes the each of the via conductors or the through-hole conductors (25a) and connects to each other conductor layers that are adjacent to each other via the insulating layer.

The intra core substrate insulating layers (24a-24f), the interlayer insulating layers (14a-14c) and the interlayer insulating layers 34 are formed using an arbitrary insulating material. Examples of the insulating material include an epoxy resin, a bismaleimide triazine resin (BT resin), a phenol resin, and the like. The insulating layers formed using these resins may each contain a reinforcing material such as a glass fiber or an aramid fiber, and/or inorganic filler such as silica.

In the example of FIG. 1, the intra core substrate insulating layers (24a-24f) each include a reinforcing material 241. Examples of the reinforcing material 241 include, but not limited to, the above-described glass fiber and aramid fiber, and further a glass nonwoven fabric, an aramid nonwoven fabric, and the like. Each of the intra core substrate insulating layers (24a-24f) has a thickness of, for example, 40 μm or more and 200 μm or less.

On the other hand, in the example of FIG. 1, the insulating layers (14a-14c) and the insulating layers 34 are each formed of a resin exemplified above such as an epoxy resin that does not contain a reinforcing material. The interlayer insulating layers (14a-14c) and the interlayer insulating layers 34 each have a thickness of, for example, 10 μm or more and less than 40 μm.

The thickness of each of the intra core substrate insulating layers (24a-24f), the interlayer insulating layers (14a-14c) and the interlayer insulating layers 34 is a thickness of the each insulating layer in a region sandwiched by conductor patterns of conductor layers that are adjacent to each other via the each insulating layer.

The first and second conductor layers (11, 22), the conductor layers (23a-23e), the conductor layer (13a), the conductor layer (13b), and the conductor layers 33 are each formed of, for example, a metal foil, a vapor-deposited film, or a plating film alone containing copper, nickel, silver, palladium, or the like, or are each formed of a laminate of the foil and films.

Figure 2A:
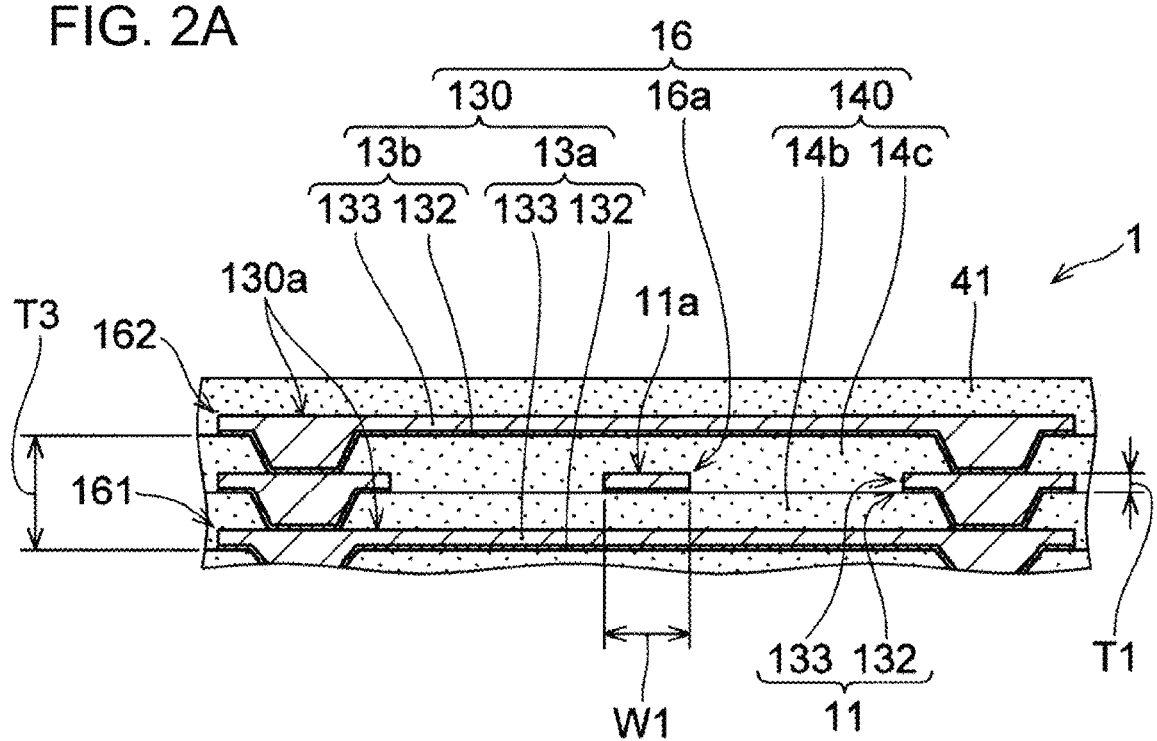
FIG. 2A is an enlarged view of a portion (IIA) of FIG. 1.

In the example of FIG. 1, the first conductor layer 11 and the conductor layers (13a, 13b) in the first laminate 1, and the conductor layers 33 in the second laminate 3 are each formed without using a metal foil. As illustrated in FIG. 2A, the first conductor layer 11 and the conductor layers (13a, 13b, 33) each include a seed film 132 and an electrolytic plating film 133. The seed film 132 is used as a power feeding layer when the electrolytic plating film 133 is formed. The conductor layers of the first laminate 1 and the second laminate 3 of the example of FIG. 1 are each formed, for example, using a semi-additive (SAP: Semi-Additive Process) method in which a metal foil is not used.

The conductor layers in the first laminate 1 and the conductor layers 33 in the second laminate 3 each have a thickness of, for example, 10 μm or more and less than 20 μm. In this way, in the first laminate 1 and the second laminate 3, Each of the conductor layers that does not includes a metal foil can have a wiring pattern formed according to a wiring rule of (10 μm)/(10 μm) regarding a (minimum line width)/(minimum line spacing) (US). Therefore, in the first and second laminates (1, 3), it is possible to form thinner wirings positioned at a finer pitch than in the core substrate 2 having the conductor layers that each include a metal foil (to be described below).

Figure 2B:
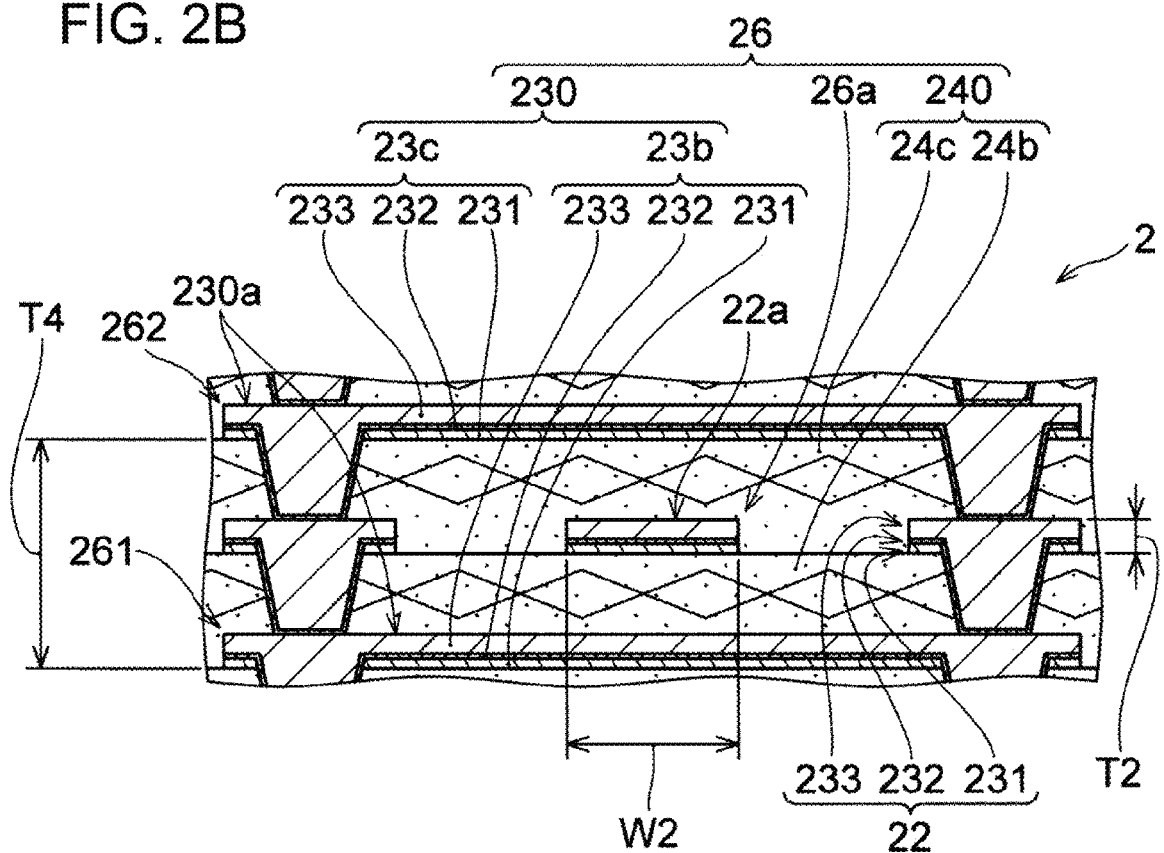
FIG. 2B is an enlarged view of a portion (IIB) of FIG. 1.

On the other hand, in the example of FIG. 1, as illustrated in FIG. 2B, the second conductor layer 22 and the conductor layers (23a-23e) in the core substrate 2 each include a metal foil 231, a seed film 232, and an electrolytic plating film 233. The seed film 232 is used as a power feeding layer when the electrolytic plating film 233 is formed. The conductor layers in the core substrate 2 of the example of FIG. 1 are each formed, for example, using a subtractive method, or using a semi-additive (MSAP: Modified Semi-Additive Process) method in which a metal foil is used. In this way, when the metal foil 231 is included, the conductor layers in the core substrate 2 each have a thickness of, for example, 20 μm or more and 70 μm or less. Further, the second conductor layer 22 and the conductor layers (23a-23e) in the core substrate 2 can each have, for example, a wiring pattern formed according to a wiring rule of (30 μm)/(30 μm) regarding a (minimum line width)/(minimum line spacing) (L/S).

Each of the via conductors 15, the via conductors (25b), the via conductors (25c), and the via conductors 35 is a so-called filled via formed by filling a conductor in a through hole penetrating an insulating layer that includes the each of the via conductors. Each of the via conductors is integrally formed with a conductor layer on an upper side of the each of the via conductors. The via conductors are each formed, for example, by the seed film 132 or the seed film 232, and, the plating film 133 or the plating film 233 described above.

The through-hole conductors (25a) are each integrally formed with the conductor layer (23a) and with the conductor layer (23e) on the second base surface (B2) by filling a through hole provided in the intra core substrate insulating layer (24a) with a seed film 232 and a plating film 233 formed of copper, nickel, or the like.

In the wiring substrate 100, multiple via conductors (25b), a through-hole conductor (25a) and multiple via conductors (25c) are stacked to overlap each other in a plan view. By the multiple via conductors (25b), the multiple via conductors (25c), and the through-hole conductor (25a) stacked in this way, a stacked via conductor 250 is formed connecting the conductor layer (23d) on the first surface (2a) and the conductor layer (23e) on the second surface (2b) to each other. The core substrate 2 can have such stacked via conductors 250 that connect the conductor layer (23d) forming the first surface (2a) and the conductor layer (23e) forming the second surface (2b) to each other via a substantially shortest path. The conductor layers on the front and back sides of the core substrate 2 can be electrically connected to each other via a path having a small electrical resistance. The core substrate 2 and the wiring substrate 100 can be reduced in planar size.

The conductor layers included in the core substrate 2 and the first and second laminates (1, 3) can each include any conductor pattern. As illustrated in FIG. 2A, the first conductor layer 11 includes at least a first line pattern (16a). The first line pattern (16a) has a predetermined line width (W1) and extends in a direction orthogonal to the line width (W1). On a lower side of the first conductor layer 11, the conductor layer (13a) that is adjacent to the first conductor layer 11 via the interlayer insulating layer (14b) includes at least a shield pattern 161. On an upper side of the first conductor layer 11, the conductor layer (13b) that is adjacent to the first conductor layer 11 via the interlayer insulating layer (14c) includes at least a shield pattern 162. The first line pattern (16a) is sandwiched by a pair of interlayer insulating layers 140 including the interlayer insulating layer (14b) and the interlayer insulating layer (14c). Further, the pair of interlayer insulating layers 140 is sandwiched by a pair of conductor layers 130 including the conductor layer (13a) and the conductor layer (13b).

The shield pattern 161 and the shield pattern 162 are conductor patterns that are respectively portions of the conductor layer (13a) and the conductor layer (13b). The shield pattern 161 and the shield pattern 162 each overlap with the first line pattern (16a) in a plan view, and each have a length longer than the line width (W1) in the line width (W1) direction of the first line pattern (16a). The shield pattern 161 and the shield pattern 162 are each a conductor pattern such as a ground conductor pattern or a power source conductor pattern that has little potential fluctuation, and preferably are each a conductor pattern connected to a ground potential. Therefore, the shield pattern 161 and the shield pattern 162 can function as an electromagnetic shield with respect to the first line pattern (16a). That is, a strip line (first strip line 16) is formed by the first line pattern (16a), the pair of interlayer insulating layers 140, and the pair of conductor layers 130 (specifically, the two shield patterns (161, 162)). In the example of FIGS. 1 and 2A, the first strip line 16 is included in the first laminate 1.

On the other hand, as illustrated in FIG. 2B, the second conductor layer 22 in the core substrate 2 includes at least a second line pattern (26a). The second line pattern (26a) has a predetermined line width (W2) and extends in a direction orthogonal to the line width (W2). On a lower side of the second conductor layer 22, the conductor layer (23b) that is adjacent to the second conductor layer 22 via the intra core substrate insulating layer (24b) includes at least a shield pattern 261. On an upper side of the second conductor layer 22, the conductor layer (23c) that is adjacent to the second conductor layer 22 via the intra core substrate insulating layer (24c) includes at least a shield pattern 262. The second line pattern (26a) is sandwiched by a pair of intra core substrate insulating layers 240 including two intra core substrate insulating layers (the intra core substrate insulating layer (24b) and the intra core substrate insulating layer (24c)). Further, the pair of intra core substrate insulating layers 240 is sandwiched by a pair of conductor layers 230 including the conductor layer (23b) and the conductor layer (23c).

The shield pattern 261 and the shield pattern 262 are conductor patterns that are respectively portions of the conductor layer (23b) and the conductor layer (23c). The shield pattern 261 and the shield pattern 262 each overlap with the second line pattern (26a) in a plan view, and each have a length longer than the line width (W2) in the line width (W2) direction of the second line pattern (26a). Similar to the shield pattern 161 and the like, the shield pattern 261 and the shield pattern 262 are each a conductor pattern such as a ground conductor pattern that has little potential fluctuation. Therefore, the shield pattern 261 and the shield pattern 262 can function as an electromagnetic shield with respect to the second line pattern (26a). That is, in the core substrate 2, a strip line (second strip line 26) is formed by the second line pattern (26a), the pair of intra core substrate insulating layers 240 and the pair of conductor layers 230 (specifically, the two shield patterns (261, 262)). The core substrate 2 includes the second strip line 26.

Referring to FIGS. 2A and 2B, the second line pattern (26a) has a thickness (T2) larger than a thickness (T1) of the first line pattern (16a). Further, the second line pattern (26a) has the line width (W2) larger than the line width (W1) of the first line pattern (16a). On the other hand, the pair of intra core substrate insulating layers 240 has a thickness (T4) larger than a thickness (T3) of the pair of interlayer insulating layers 140. The thickness (T3) of the pair of interlayer insulating layers 140 is a distance between the conductor layer (13a) and the conductor layer (13b) forming the pair of conductor layers 130. The thickness (T4) of the pair of intra core substrate insulating layers 240 is a distance between the conductor layer (23b) and the conductor layer (23c) forming the pair of conductor layers 230.

In this way, in the present embodiment, a strip line is provided in both the core substrate 2 and the first laminate 1. As described above, the first laminate 1 is formed by conductor layers and insulating layers that can have different materials (for example, presence of absence of the reinforcing material 241) and different thicknesses from the conductor layers and the insulating layers forming the core substrate 2. In addition, the first laminate 1 is formed by conductor layers that can have different wiring rules from the conductor layers forming the core substrate 2. However, in the present embodiment, the structural elements of the second strip line 26 formed in the core substrate 2 have structures obtained by appropriately geometrically enlarging the structural elements of the first strip line 16. Therefore, for example, a characteristic impedance of the first strip line 16 and a characteristic impedance of the second strip line 26 can be easily brought close to each other.

That is, a signal transmission path with less reflection or attenuation in high frequency signal transmission can be formed not only in the first laminate 1 in which fine-pitch wiring can be formed but also in the core substrate 2. Thus, it is thought that good signal integrity can be obtained even when high-frequency signal transmission paths are provided in both the core substrate 2 and the laminate of the conductor layers and the insulating layers formed on the core substrate 2. Therefore, it is thought that design flexibility regarding positioning of a high frequency signal transmission path is improved. As a result, the number of layers of the wiring substrate can be reduced, or a planar size of the wiring substrate can be reduced.

For example, in the example of FIG. 1, the first line pattern (16a) and the second line pattern (26a), each having a strip line structure, are formed at positions overlapping each other in a plan view. Therefore, as compared to a case where two line patterns each having a strip line structure are formed in the same conductor layer, a size of the wiring substrate 100 can be reduced. The first line pattern (16a) and the second line pattern (26a) may extend along the same direction so as to overlap each other in a plan view. That is, it is also possible that multiple transmission paths suitable for a high frequency signal are respectively provided in conductor layers having mutually different structures so as to extend in parallel in a cross section along the thickness direction of the wiring substrate.

Further, as described above, the core substrate 2 can have a relatively thick conductor layer. Therefore, by forming the second strip line 26 in the core substrate 2, a transmission path having a characteristic impedance suitable for a high frequency signal and a relatively low electric resistance can be obtained. It is thought that, even when a long high frequency signal transmission line is provided, a voltage drop and heat generation in the transmission line are small.

Examples of the first strip line 16 and the second strip line 26 are described below. An example of the line width (W1) of the first line pattern (16a) is 20 µm. An example of the thickness (T1) of the first line pattern (16a) is 15 µm. An example of the thickness (T3) of the pair of interlayer insulating layers 140 is 75 µm. When the elements of the first strip line 16 have these exemplary conditions and a relative permittivity of the pair of interlayer insulating layers 140 is 3.3 with respect to a signal of a frequency of, for example, 1 GHz, the first strip line 16 can have a characteristic impedance of about 50 S with respect to a signal of the above frequency.

When the first strip line 16 has the above conditions, the line width (W2) of the second line pattern (26a) is, for example, 30 µm. The thickness (T2) of the second line pattern (26a) is, for example, 35 µm. The thickness (T4) of the pair of intra core substrate insulating layers 240 is, for example, 155 µm. When the elements of the second strip line 26 have these conditions and a relative permittivity of the pair of intra core substrate insulating layers 240 is 3.7 with respect to a signal of a frequency of, for example, 1 GHz, the second strip line 26 can have a characteristic impedance of about 50Ω with respect to a signal of the above frequency.

By properly selecting the line widths and thicknesses of the first and second line patterns (16a, 26a) and the thicknesses and relative permittivities of the pair of interlayer insulating layers 140 and the pair of intra core substrate insulating layers 240, desired characteristic impedances of the strip lines can be obtained. For example, the characteristic impedance of the first strip line 16 and the characteristic impedance of the second strip line 26 may be substantially equal to each other. Signal transmission paths respectively connected to multiple outputs of a high frequency electronic device having the same output impedance as each other can be respectively formed in the first laminate 1 and the core substrate 2.

The pair of interlayer insulating layers 140 and the pair of intra core substrate insulating layers 240 respectively form the strip lines, and thus, preferably both have a low relative permittivity and a low dielectric loss tangent. Further, in comparison between the pair of interlayer insulating layers 140 and the pair of intra core substrate insulating layers 240, the relative permittivity of the pair of intra core substrate insulating layers 240 may be higher than the relative permittivity of the pair of interlayer insulating layers 140. Further, the dielectric loss tangent of the pair of intra core substrate insulating layers 240 may be higher than the dielectric loss tangent of the pair of interlayer insulating layers 140. In that case, restriction on the material of the intra core substrate insulating layers (for example, the intra core substrate insulating layers (24*b*-24*f*)) due to the relative permittivity is relaxed, and accordingly, it is possible to suitably select a material from a point of view of values of physical properties such as a thermal expansion coefficient and/or a Young's modulus.

The first line pattern (16*a*) and the second line pattern (26*a*) are both high frequency signal transmission paths. Therefore, in the first line pattern (16*a*) and the second line pattern (26*a*), a skin effect appears when the wiring substrate 100 is used, and actual transmission paths are likely to be respectively limited to vicinities of surfaces thereof. On the other hand, a conductor layer in the wiring substrate is subjected to a roughening treatment in order to increase adhesion with an insulating layer laminated on the conductor layer. In this case, influence of the skin effect is likely to appear in high frequency signal transmission. In order to reduce the influence of such a skin effect, the surfaces of the first and second line patterns (16*a*, 26*a*) are rather preferably each subjected to a low-roughness surface treatment to reduce surface roughness.

Therefore, surface roughness of a surface (11*a*)(on an opposite side with respect to the core substrate 2) of the first conductor layer 11 including the first line pattern (16*a*) may be lower than surface roughness of a surface (130*a*) (on an opposite side with respect to the core substrate 2) of any conductor layer (any one of the conductor layer (13*a*) and the conductor layer (13*b*)) other than the first conductor layer 11 in the first laminate 1.

Similarly, surface roughness of a surface (22*a*) (on the first conductor layer 11 side) of the second conductor layer 22 including the second line pattern (26*a*) may be lower than surface roughness of a surface (230*a*) (on the first conductor layer 11 side) of any conductor layer (any one of the conductor layers (23*a*-23*e*)) other than the second conductor layer 22 in the core substrate 2. In particular, the surface roughness of the surface (22*a*) of the second conductor layer 22 may be lower than the surface roughness of the surface (230*a*) of any one of the conductor layers (23*a*-23*d*) laminated on the first surface (2*a*) side of the base insulating layer (intra core substrate insulating layer (24*a*)) of the core substrate 2.

When the characteristic impedance of the first strip line 16 and the characteristic impedance of the second strip line 26 are substantially the same, the first line pattern (16*a*) and the second line pattern (26*a*) may be electrically connected to each other. FIG. 3 conceptually illustrates connection between the first line pattern (16*a*) and the second line pattern (26*a*). FIG. 3 illustrates an example in which, in the wiring substrate 100 of FIG. 1, the first line pattern (16*a*) and the second line pattern (26*a*) are respectively formed along directions orthogonal to each other, and are connected to each other at their end portions that overlap each other in a plan view.

In the example in FIG. 3, the first line pattern (16*a*) and the second line pattern (26*a*) are connected to each other by a stacked via conductor 150. The stacked via conductor 150 is conceptually illustrated in a cylindrical shape in FIG. 3. The stacked via conductor 150 can be formed, for example, by stacking via conductors 15 that respectively penetrate the interlayer insulating layers (14*a*, 14*b*) and via conductors (25*b*) that respectively penetrate the intra core substrate insulating layers (24*d*, 24*e*) illustrated in FIG. 1. One signal transmission path can be electrically positioned over multiple conductor layers depending on whether or not a high-frequency signal transmission path can be positioned based on a positioning state of conductor patterns in the conductor layers.

Different from the example of FIG. 3, it is also possible that the first line pattern (16*a*) and the second line pattern (26*a*) are electrically separated. And, it is also possible that the first strip line 16 and the second strip line 26 have mutually different characteristic impedances. In this case, for example, signal transmission paths respectively connected to multiple outputs of a high frequency electronic device having mutually different output impedances can be positioned in the wiring substrate 100.

Figure 4A:
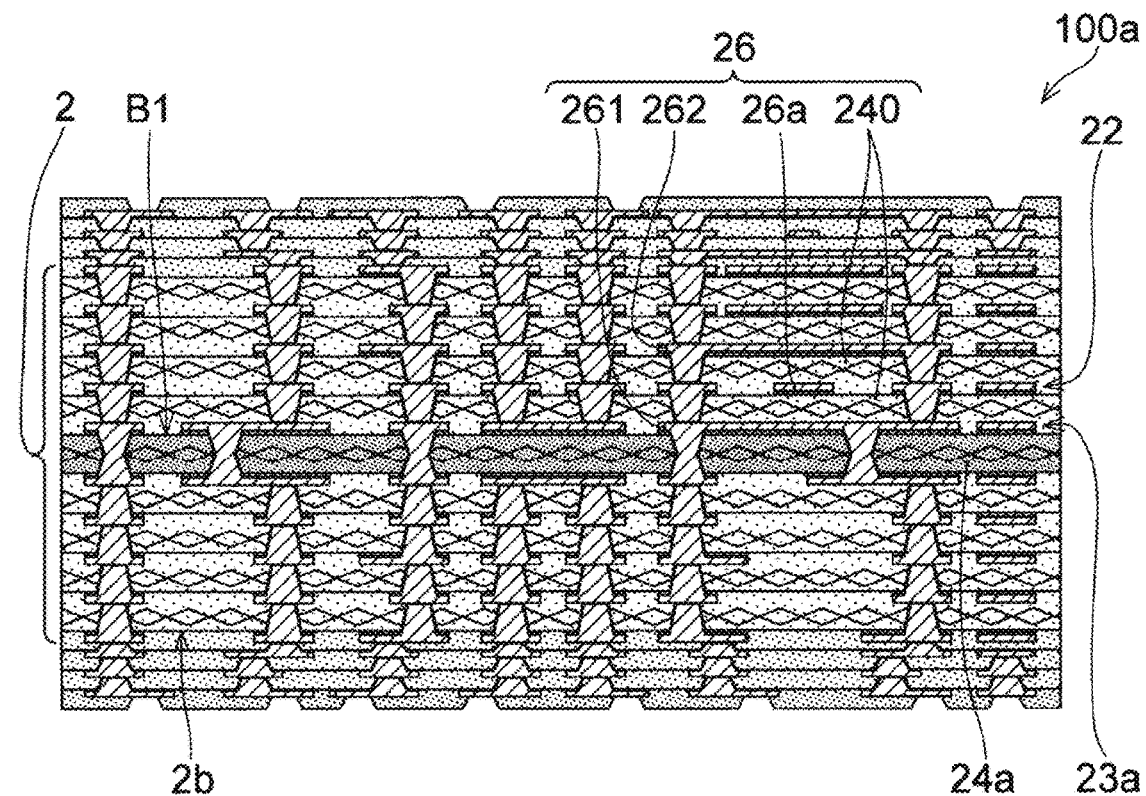
FIG. 4A is a cross-sectional view illustrating another example of the wiring substrate of the embodiment.
Figure 4B:
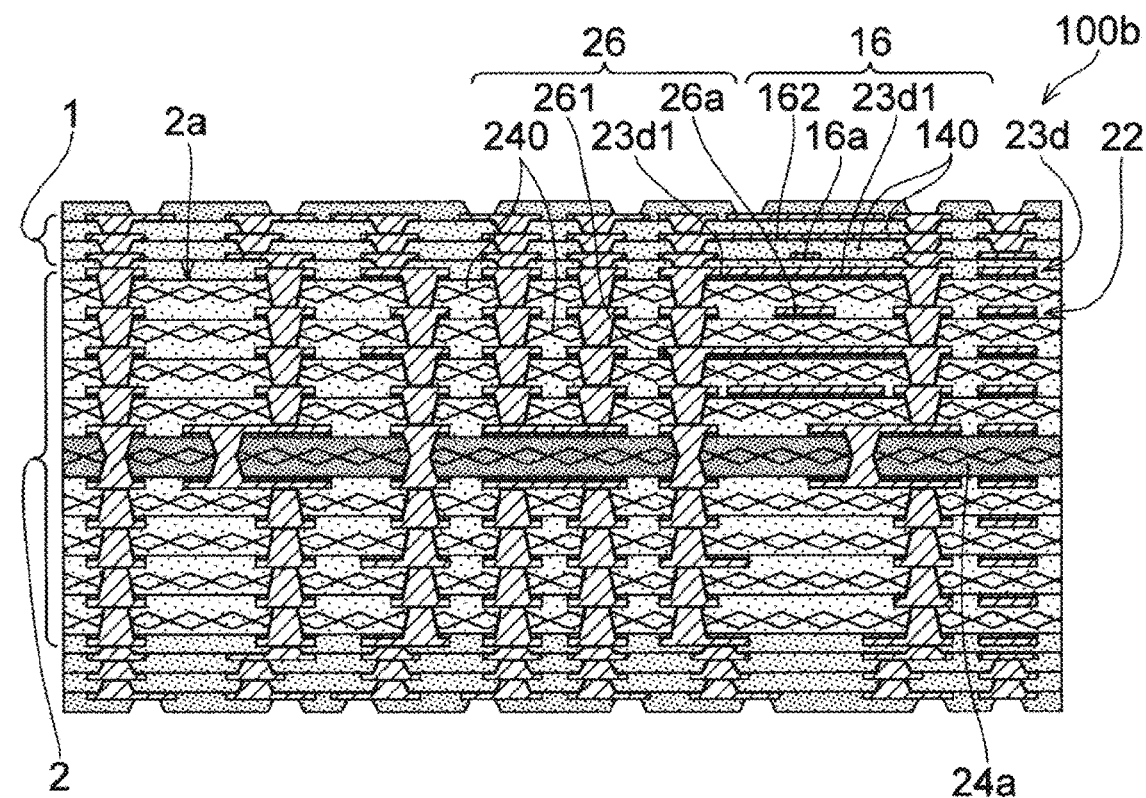
FIG. 4B is a cross-sectional view illustrating yet another example of the wiring substrate of the embodiment.
Figure 4C:
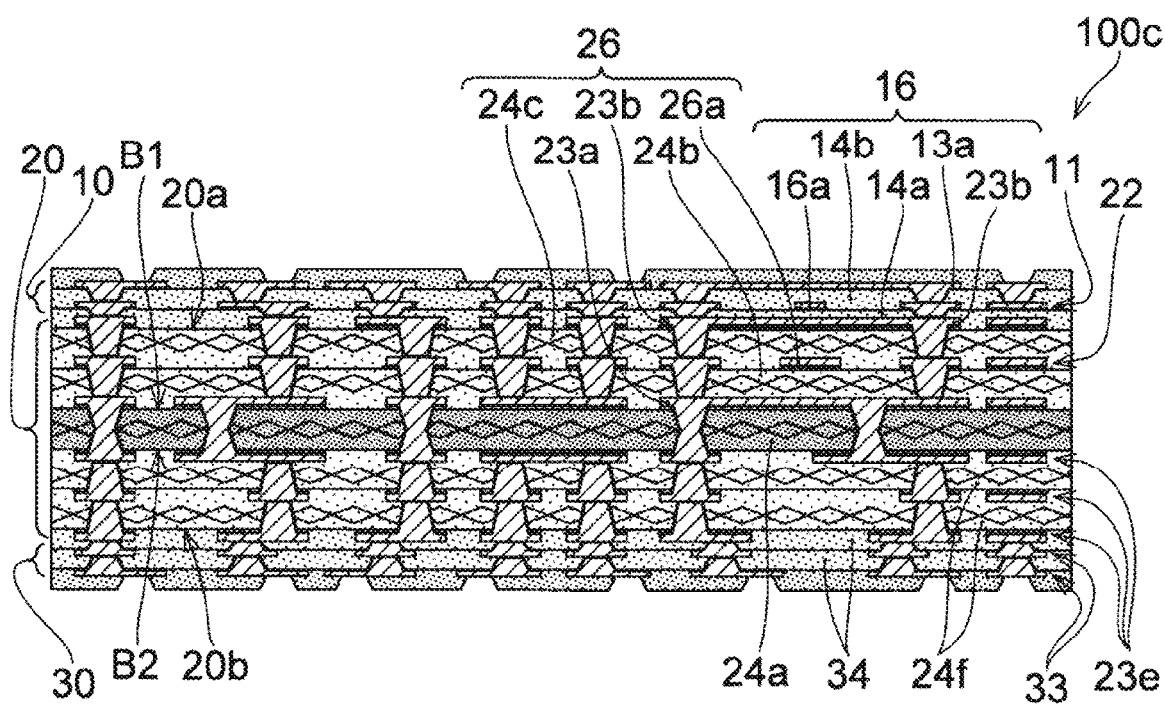
FIG. 4C is a cross-sectional view illustrating still another example of the wiring substrate of the embodiment.

FIGS. 4A-4C respectively illustrate wiring substrates (100*a*-100*c*) which are other examples of the wiring substrate of the present embodiment. In the wiring substrate (100*a*) illustrated in FIG. 4A, the second conductor layer 22 including the second line pattern (26*a*) is provided as the second conductor layer from the first base surface (B1) of the base insulating layer (intra core substrate insulating layer (24*a*)) in the core substrate 2. Therefore, the shield pattern 261 of the second strip line 26 is formed by a conductor pattern in the conductor layer (23*a*) formed on the first base surface (B1). In this way, a portion of the second strip line 26 may be formed by a conductor pattern provided on the surface of the base insulating layer of the core substrate 2.

In the wiring substrate of the embodiment, the second conductor layer 22 may be provided as a conductor layer on the second surface (2*b*) side of the base insulating layer (intra core substrate insulating layer (24*a*)) of the core substrate 2. That is, the second strip line 26 may be formed on the second surface (2*b*) side of the base insulating layer. The structure of the wiring substrate (100*a*) in the example of FIG. 4A is the same as the structure of the wiring substrate 100 of FIG. 1 except for the layer where the second strip line 26 is provided. A structural element that is the same as a structural element of the wiring substrate 100 of FIG. 1 is appropriately indicated in FIG. 4A using the same reference numeral symbol as in FIG. 1, and description thereof is omitted.

In the wiring substrate (100*b*) illustrated in FIG. 4B, the second conductor layer 22 including the second line pattern (26*a*) is provided as the second conductor layer from the outermost conductor layer (conductor layer (23*d*)) on the first surface (2*a*) side (first laminate 1 side) of the core substrate 2. Therefore, a shield pattern of the second strip line 26 on the first surface (2*a*) side of the core substrate 2 is formed by a conductor pattern (23*dl*) in the conductor layer (23*d*).

On the other hand, the first conductor layer 11 including the first line pattern (16*a*) of the first strip line 16 is provided as the lowermost conductor layer (the conductor layer positioned closest to the core substrate 2) in the first laminate 1. Therefore, a shield pattern on the core substrate 2 side of the first strip line 16 is formed by the conductor pattern (23d1) in the conductor layer (23d) of the core substrate 2. That is, the conductor pattern (23d1) of the conductor layer (23d) is shared by the first strip line 16 and the second strip line 26. In other words, the conductor layer on the core substrate 2 side among the pair of conductor layers 130 (see FIG. 2A) forming the first strip line 16 is the conductor layer (conductor layer (23d)) on the first conductor layer 11 side among the pair of conductor layers 230 (see FIG. 2B) forming the second strip line 26.

In the wiring substrate of the embodiment, as in the example of FIG. 4B, a conductor layer forming a part of the first strip line 16 and a conductor layer forming a part of the second strip line 26 may be the same conductor layer. Even when the conductor layer (23d) is shared by the first and second strip lines (16, 26) as in the example of FIG. 4B, different from the example of FIG. 4B, a conductor pattern forming a shield pattern may be different between the first strip line 16 and the second strip line 26. The structure of the wiring substrate (100b) in the example of FIG. 4B is the same as the structure of the wiring substrate 100 of FIG. 1 except for the layers where the first strip line 16 and the second strip line 26 are respectively provided. A structural element that is the same as a structural element of the wiring substrate 100 of FIG. 1 is appropriately indicated in FIG. 4B using the same reference numeral symbol as in FIG. 1, and description thereof is omitted.

The wiring substrate (100c) in the example in FIG. 4C includes a core substrate 20, a first laminate 10 formed on a first surface (20a) of the core substrate 20, and a second laminate 30 formed on a second surface (20b) of the core substrate 20. The core substrate 20 includes three conductor layers (a conductor layer (23a), a second conductor layer 22, and a conductor layer (23b)) and two intra core substrate insulating layers (intra core substrate insulating layers (24b, 24c)) which are alternately laminated on a first base surface (B1) side of a base insulating layer (intra core substrate insulating layer (24a)). Further, the core substrate 20 includes three conductor layers (23e) and two intra core substrate insulating layers (24f) alternately laminated on a second base surface (B2) side.

In the first laminate 10, from the core substrate 20 side, an interlayer insulating layer (14a), a first conductor layer 11, an interlayer insulating layer (14b), and a conductor layer (13a) are laminated in this order. In the second laminate 30, two interlayer insulating layers 34 and two conductor layers 33 are alternately laminated.

The first conductor layer 11 includes a first line pattern (16a). A first strip line 16 is formed by the first line pattern (16a), the interlayer insulating layer (14a) and the interlayer insulating layer (14b) sandwiching the first line pattern (16a), and the conductor layer (23b) and the conductor layer (13a). On the other hand, the second conductor layer 22 of the core substrate 20 includes a second line pattern (26a). A second strip line 26 is formed by the second line pattern (26a), the intra core substrate insulating layer (24b) and the intra core substrate insulating layer (24c) sandwiching the second line pattern (26a), and the conductor layer (23a) and the conductor layer (23b). That is, also in the wiring substrate (100c), a conductor pattern of the outermost conductor layer (conductor layer (23b)) on the first surface (20a) side of the core substrate 20 is shared by the first and second strip lines (16, 26).

The wiring substrate (100c) includes only five conductor layers on the first base surface (B1) side of the core substrate 20 (one side in a thickness direction of the wiring substrate (100c)). However, the wiring substrate (100c) has two strip lines (the first and second strip lines (16, 26)) in different layers on the first base surface (B1) side of the core substrate 20. The second strip line 26 is formed in the core substrate 20, and the first line pattern (16a) of the first strip line 16 is formed in the first laminate 10. That is, in the wiring substrate (100c), although the number of the conductor layers and the number of the insulating layers are small, the strip lines are respectively formed in the two laminates (the first laminate 10 and the core substrate 20) of conductor layers and insulating layers having mutually different structures.

The structure of the wiring substrate (100c) in the example of FIG. 4B is the same as the structure of the wiring substrate 100 of FIG. 1 except for the number of layers in each of the first and second laminates (10, 30). A structural element that is the same as a structural element of the wiring substrate 100 of FIG. 1 is appropriately indicated in FIG. 4C using the same reference numeral symbol as in FIG. 1, and description thereof is omitted.

Next, using the wiring substrate 100 illustrated in FIG. 1 as an example, a method for manufacturing a wiring substrate according to an embodiment of the present invention is described with reference to FIGS. 5A-5E.

As illustrated in FIGS. 5A-5E, the method for manufacturing the wiring substrate of the present embodiment includes forming a core substrate 2 of a multilayer structure having a first surface (2a) and a second surface (2b) on an opposite side with respect to the first surface (2a) by laminating insulating layers and conductor layers. A method for manufacturing a wiring substrate according to an present embodiment of the present invention includes forming laminates (a first laminate 1 and a second laminate 3) of insulating layers and conductor layers by further laminating insulating layers and conductor layers on the first surface (2a) and the second surface (2b). In the formation of the core substrate 2, conductor layers that each include a metal foil are laminated, and in the formation of the first laminate 1 and the second laminate 3, conductor layers that do not each include a metal foil are laminated. First, a method for forming the core substrate 2 is described below.

Figure 5A:
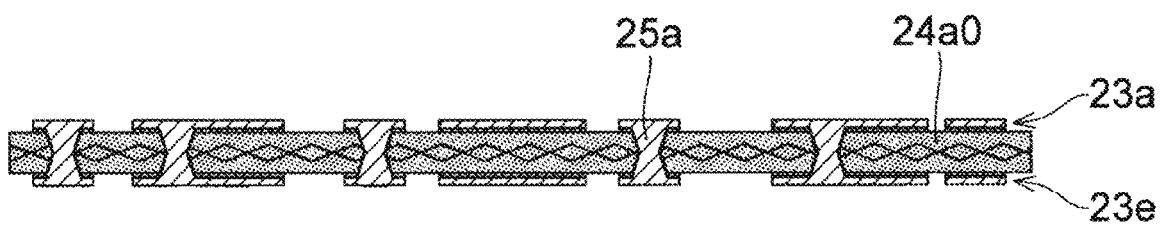
FIG. 5A is a cross-sectional view illustrating an example of a state after a starting substrate is formed in a method for manufacturing a wiring substrate according to an embodiment of the present invention.

As illustrated in FIG. 5A, a starting substrate is prepared that includes an insulating substrate (24a0) as a base insulating layer of the core substrate 2 and metal foils respectively laminated on both sides of the insulating substrate (24a0). For example, a double-sided copper clad laminated plate having a copper foil on each of both front and back sides is prepared as the starting substrate. Through holes for forming through-hole conductors (25a) are formed in the double-sided copper-clad laminated plate by, for example, irradiation of $CO_2$ laser, and a conductor film is formed on inner walls of the through holes and on surfaces of the double-sided copper-clad laminated plate by electroless plating, sputtering, or the like. Then, a conductor layer (23a) and a conductor layer (23e), each having a desired conductor pattern, and the through-hole conductors (25a) are formed using a subtractive method including electrolytic plating using the conductor film as a seed layer and a power feeding layer, and etching using an appropriate mask. It is also possible that the conductor layers (23a, 23e) and the through-hole conductors (25a) are formed using a semi-additive method (MSAP method) in which a metal foil is used.

Figure 5B:
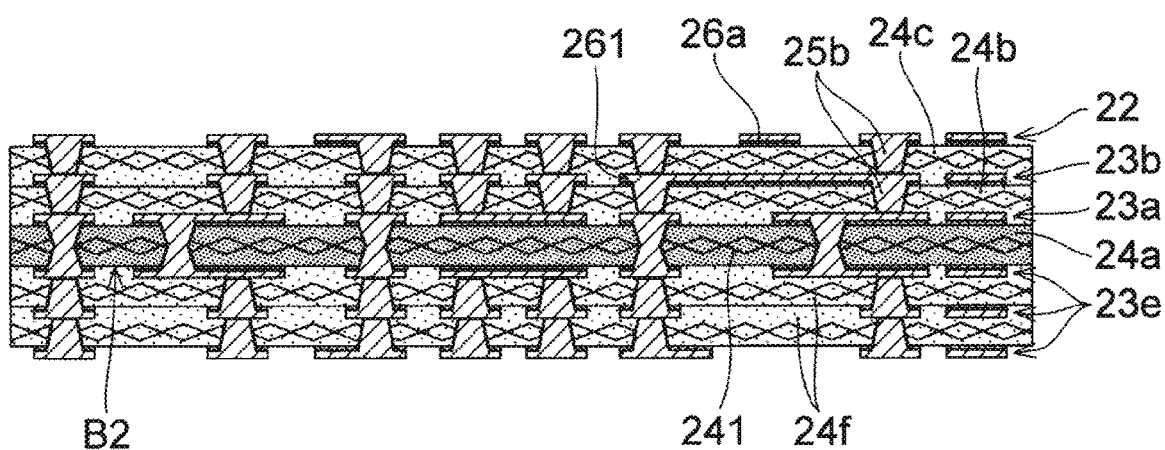
FIG. 5B is a cross-sectional view illustrating an example of a state after a second conductor layer is formed in the method for manufacturing the wiring substrate of the embodiment.

As illustrated in FIG. 5B, a second line pattern (26a) is formed. First, a metal foil and a prepreg containing a reinforcing material 241 are thermocompression-bonded onto the conductor layer (23a), and an intra core substrate insulating layer (24b) is formed. Through holes are formed at formation positions of via conductors (25b) in the intra core substrate insulating layer (24b) and the metal foil thereon by, for example, irradiation of $CO_2$ laser. Then, a conductor layer (23b) having a desired conductor pattern, and the via conductors (25b) penetrating the intra core substrate insulating layer (24b) are formed using a subtractive method or an MSAP method. The insulating substrate (24a0) forms the base insulating layer (intra core substrate insulating layer (24a)) of the core substrate 2. An intra core substrate insulating layer (24f) and a conductor layer (23e) are formed on the second base surface (B2) side of the intra core substrate insulating layer (24a).

The conductor layer (23b) is formed so as to have at least a shield pattern 261. That is, the conductor layer (23b) is formed using an etching mask having a mask part corresponding to the shield pattern 261 or a plating resist having an opening corresponding to the shield pattern 261.

Further, an intra core substrate insulating layer (24c) is formed on the conductor layer (23b) using the same method as the intra core substrate insulating layer (24b). Further, a second conductor layer 22 is formed using the same method as the conductor layer (23b). The via conductors (25b) penetrating the intra core substrate insulating layer (24c) are formed together with the second conductor layer 22. A subtractive method or an MSAP method is used. Another intra core substrate insulating layer (24f) and another conductor layer (23e) are further formed on the second base surface (B2) side of the intra core substrate insulating layer (24a).

The second conductor layer 22 is formed so as to have at least a second line pattern (26a). That is, the second conductor layer 22 is formed using an etching mask having a mask part corresponding to the second line pattern (26a) or a plating resist having an opening corresponding to the second line pattern (26a). As will be described later, the second line pattern (26a) is a conductor pattern for forming a signal transmission path of a second strip line 26. Therefore, the second line pattern (26a) is formed such that the shield pattern 261 can function as an electromagnetic shield of the second line pattern (26a). That is, the second line pattern (26a) is formed so as to overlap with the shield pattern 261 in a plan view, or to be included in the shield pattern 261 in a plan view.

The formation of the second conductor layer 22 may include reducing surface roughness of a surface of the second conductor layer 22 after the formation. Influence of a skin effect when a high frequency signal propagates in the second line pattern (26a) can be reduced. For example, the surface of the second line pattern (26a) is roughened by performing soft etching. Providing the second line pattern (26a) in this way may include reducing the surface roughness of the second line pattern (26a) to a surface roughness lower than that immediately after the formation of the second conductor layer 22.

Figure 5C:
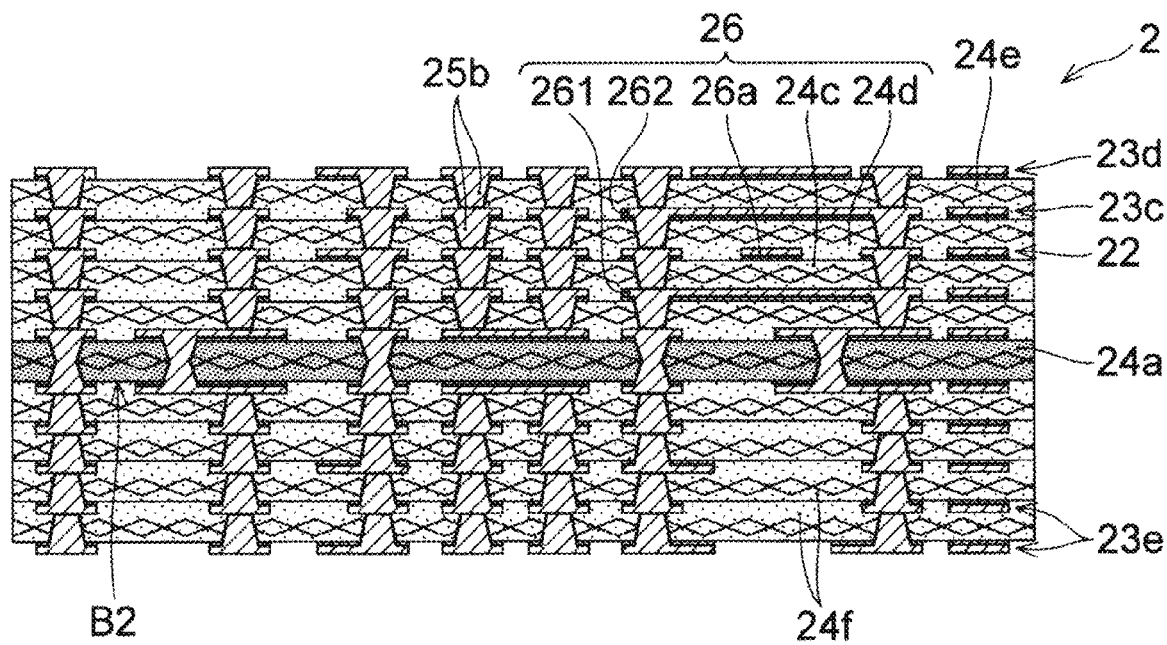
FIG. 5C is a cross-sectional view illustrating an example of a state after a core substrate is formed in the method for manufacturing the wiring substrate of the embodiment.

As illustrated in FIG. 5C, an intra core substrate insulating layer (24d), a conductor layer (23c), an intra core substrate insulating layer (24e), and a conductor layer (23d) are further formed on the second conductor layer 22. The intra core substrate insulating layers (24d, 24e) are formed using the same method as the intra core substrate insulating layer (24c). Similar to the second conductor layer 22, the conductor layer (23c) and the conductor layer (23d) are formed using a subtractive method or an MSAP method. Via conductors (25b) are formed in each of the intra core substrate insulating layers (24d, 24e). Two intra core substrate insulating layers (24f) and two conductor layers (23e) are further alternately formed on the second base surface (B2) side of the intra core substrate insulating layer (24a).

A shield pattern 262 is provided in the conductor layer (23c) using an appropriate etching mask or plating resist. The shield pattern 262 is formed so as to be able to function as an electromagnetic shield for the second line pattern (26a), that is, to overlap with the second line pattern (26a) or to include the second line pattern (26a) in a plan view.

The core substrate 2 is formed through the processes illustrated in FIGS. 5A-5C. In the formed core substrate 2, the second strip line 26 is formed by the second line pattern (26a), the intra core substrate insulating layers (24c, 24d), and the shield patterns (261, 262). As illustrated in FIGS. 5A-5C, in the method for manufacturing the wiring substrate of the present embodiment, forming the core substrate 2 includes forming the second strip line 26 in the core substrate 2. Then, forming the second strip line 26 includes forming the second line pattern (26a).

Figure 5D:
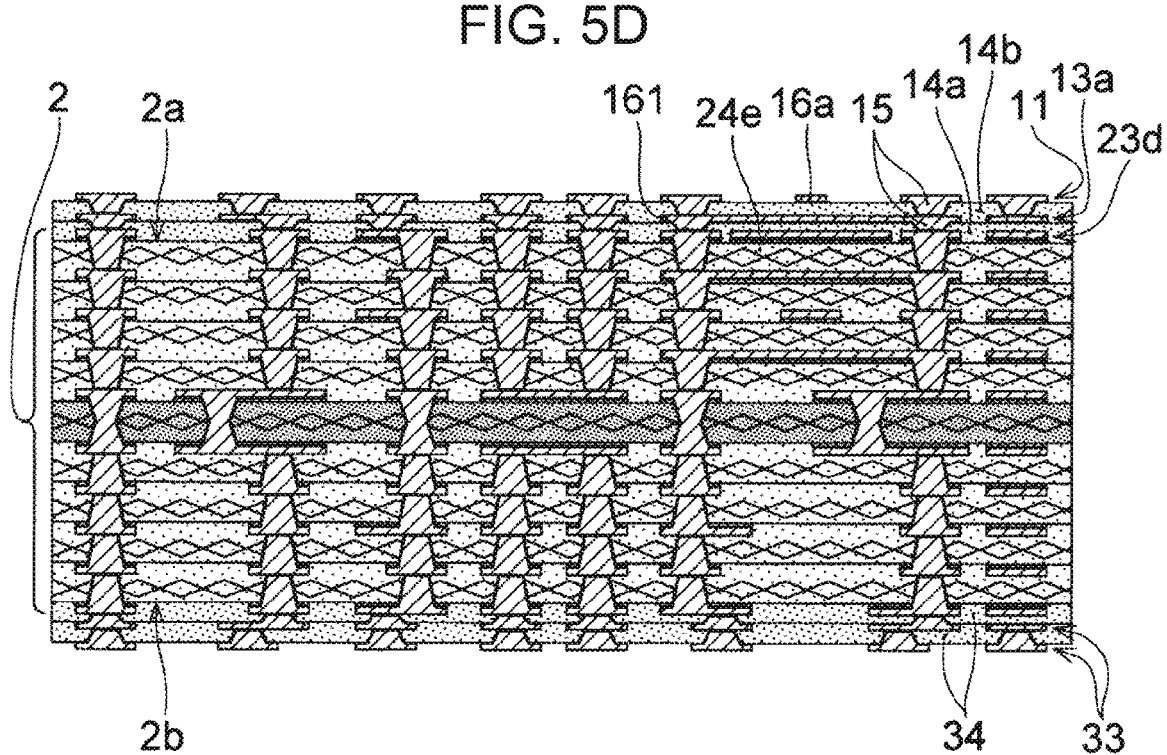
FIG. 5D is a cross-sectional view illustrating an example of a state after a first conductor layer is formed in the method for manufacturing the wiring substrate of the embodiment.

As illustrated in FIG. 5D, a first line pattern (16a) is formed. First, a film-like insulating resin (for example, an epoxy resin) is thermocompression-bonded onto the first surface (2a) of the core substrate 2 including the conductor layer (23d) and the intra core substrate insulating layer (24e), and an interlayer insulating layer (14a) is formed. Through holes are formed at formation positions of via conductors 15 in the interlayer insulating layer (14a) by, for example, irradiation of $CO_2$ laser. A conductor film is formed on inner walls of the through holes and on a surface of the interlayer insulating layer (14a) by electroless plating, sputtering, or the like. A conductor layer (13a) having a desired conductor pattern and the via conductors 15 are formed by electrolytic plating using the conductor film as a seed layer and a power feeding layer and using a plating resist having an appropriate opening. That is, the conductor layer (13a) and the via conductors 15 are formed using a subtractive method (SAP method) in which a metal foil is not used. An interlayer insulating layer 34 and a conductor layer 33 are formed on the second surface (2b) of the core substrate 2.

The conductor layer (13a) is formed so as to have at least a shield pattern 161. That is, the conductor layer (13a) is formed using a plating resist having an opening corresponding to the shield pattern 161.

Further, an interlayer insulating layer (14b) is formed on the conductor layer (13a) using the same method as the interlayer insulating layer (14a). Further, similar to the conductor layer (13a) and the like, a first conductor layer 11 and via conductors 15 penetrating the interlayer insulating layer (14b) are formed using an SAP method. Another interlayer insulating layer 34 and another conductor layer 33 are further formed on the second surface (2b) side of the core substrate 2.

The first conductor layer 11 is formed so as to have at least a first line pattern (16a). That is, the first conductor layer 11 is formed using a plating resist having an opening corresponding to the first line pattern (16a). As will be described later, the first line pattern (16a) is a conductor pattern for forming a signal transmission path of a first strip line 16. Therefore, the first line pattern (16a) is formed such that the shield pattern 161 can function as an electromagnetic shield of the first line pattern (16a). That is, the first line pattern (16a) is formed so as to overlap with the shield pattern 161 in a plan view, or to be included in the shield pattern 161 in a plan view.

When the first conductor layer 11 is formed, similar to when the above-described second conductor layer 22 is formed, surface roughness of a surface of the first conductor layer 11 may be lowered by soft etching or the like. That is, providing the first line pattern (16a) may include reducing the surface roughness of the first line pattern (16a).

Figure 5E:
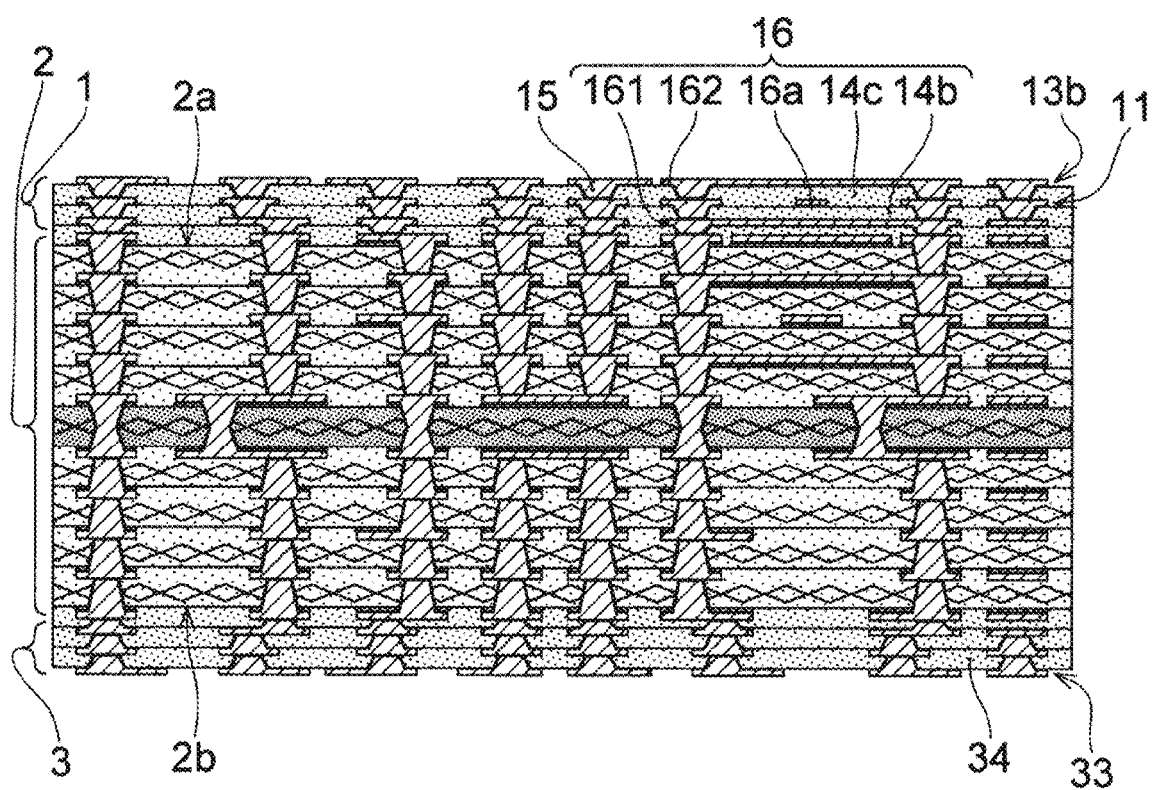
FIG. 5E is a cross-sectional view illustrating an example of a state after first and second laminates are formed in the method for manufacturing the wiring substrate of the embodiment.

As illustrated in FIG. 5E, further, an interlayer insulating layer (14c) and a conductor layer (13b) are formed on the first conductor layer 11. The interlayer insulating layer (14c) is formed using the same method as the interlayer insulating layer (14b). Similar to the first conductor layer 11, the conductor layer (13b) is formed using an SAP method. Via conductors 15 are formed in the interlayer insulating layer (14c). Another interlayer insulating layer 34 and another conductor layer 33 are further formed on the second surface (2b) side of the core substrate 2.

A shield pattern 162 is provided in the conductor layer (13b) using an appropriate plating resist. The shield pattern 162 is formed so as to be able to function as an electromagnetic shield for the first line pattern (16a), that is, to overlap with the first line pattern (16a) in a plan view or to include the first line pattern (16a) in a plan view.

Through the processes illustrated in FIGS. 5D and 5E, the first laminate 1, which is a laminate of insulating layers and conductor layers that do not each include a metal foil, is formed on the first surface (2a) of the core substrate 2. The second laminate 3 is formed on the second surface (2b) of the core substrate 2. The first strip line 16 is formed by the first line pattern (16a), the interlayer insulating layers (14b, 14c), and the shield patterns (161, 162). In the example of FIG. 5E, the first strip line 16 including the shield pattern 161 is formed in the first laminate 1. As illustrated in FIGS. 5D and 5E, the method for manufacturing the wiring substrate of the present embodiment includes forming the first strip line 16 in forming the first laminate 1. Then, forming the first strip line 16 includes forming the first line pattern (16a) using an additive method (SAP method) in which a metal foil is not used.

After that, a solder resist layer 41 is formed on the first laminate 1, and a solder resist layer 42 is formed on the second laminate 3. The solder resist layers (41, 42) are each formed by, for example, forming a resin layer containing a photosensitive epoxy resin or polyimide resin or the like, and performing exposure and development using a mask having an appropriate pattern. Through the above processes, the wiring substrate 100 in the example of FIG. 1 is completed. When necessary, a surface protective film (not illustrated in the drawings) formed of Au, Ni/Au, Ni/Pd/Au, solder, heat resistant preflux, or the like may be formed by electroless plating, solder leveling, spray coating, or the like on connection pads (13b1) and/or connection pads 331 respectively exposed from openings of the solder resist layers (41, 42).

In the above description, a method for manufacturing a wiring substrate according to an embodiment of the present invention is described using the wiring substrate 100 of FIG. 1 as an example. Therefore, the first line pattern (16a) is formed in the first laminate 1. However, it is also possible that the first line pattern (16a) is formed in the second laminate 3 in forming the second laminate 3 on the second surface (2b) of the core substrate 2. Therefore, the first strip line 16 may be formed on the second surface (2b) side of the core substrate 2.

A wiring substrate according to an embodiment of the present invention is not limited to those having the structures illustrated in the drawings and those having the structures, shapes, and materials exemplified in the present specification. For example, the first line pattern (16a) and the second line pattern (26a) may each form a differential transmission line by including two wiring patterns extending in parallel. The shield pattern 162 of the first strip line 16 may be a conductor layer formed using a conductive paste on an insulating layer. Further, the first line pattern (16a) may be formed in the second laminate 3, and the first strip line 16 may be formed on the second surface (2b) side of the core substrate 2. Further, the core substrate 2 does not necessarily have to be a substrate in which conductor layers and insulating layers are formed on both sides of a base insulating layer. For example, the core substrate 2 may be a so-called coreless multilayer substrate in which conductor layers and insulating layers are laminated only in one direction. Further, instead of the through-hole conductors (25a) included in the base insulating layer (intra core substrate insulating layer (24a)), via conductors may be used.

A method for manufacturing a wiring substrate according to an embodiment of the present invention is not limited the method described with reference to the drawings. For example, it is also possible that the core substrate 2 is formed by laminating conductor layers and insulating layers on any support plate and then removing the support plate. In the method for manufacturing the wiring substrate of the embodiment, it is also possible that any process other than the processes described above is added, or some of the processes described above are omitted.

In the wiring substrate of Japanese Patent Laid-Open Publication No. 2006-49645, flexibility regarding selection of a conductor layer and an insulating layer forming a strip line having desired electrical characteristics may be low.

A wiring substrate according to an embodiment of the present invention includes: a core substrate having a first surface and a second surface on an opposite side with respect to the first surface; a first laminate formed on the first surface and including alternately laminated insulating layers and conductor layers; and a second laminate formed on the second surface and including alternately laminated insulating layers and conductor layers. The first laminate includes: a first conductor layer including a first line pattern; and a pair of interlayer insulating layers sandwiching the first line pattern. A first strip line is formed by the first line pattern, the pair of interlayer insulating layers, and a pair of conductor layers sandwiching the pair of interlayer insulating layers. The core substrate is formed to include: multiple conductor layers including a second conductor layer including a second line pattern; and intra core substrate insulating layers respectively interposed between the multiple conductor layers. A second strip line is formed in the core substrate by the second line pattern, a pair of intra core substrate insulating layers including two of the intra core substrate insulating layers sandwiching the second line pattern, and a pair of conductor layers sandwiching the pair of intra core substrate insulating layers. A thickness of the pair of intra core substrate insulating layers is larger than a thickness of the pair of interlayer insulating layers. A thickness of the second line pattern is larger than a thickness of the first line pattern. A line width of the second line pattern is larger than a line width of the first line pattern.

A method for manufacturing a wiring substrate according to another embodiment of the present invention includes: forming a core substrate of a multilayer structure having a first surface and a second surface on an opposite side with respect to the first surface by laminating an insulating layer and a conductor layer that includes a metal foil; and forming a laminate of an insulating layer and a conductor layer by further laminating an insulating layer and a conductor layer that does not include a metal foil on the first surface and on the second surface. The forming of the laminate includes forming a first strip line in the forming of the laminate on at least one of the first surface and the second surface. The forming of the first strip line includes forming a first line pattern for forming a signal transmission path of the first strip line using an additive method in which a metal foil is not used. The forming of the core substrate includes forming a second strip line in the core substrate. The forming of the second strip line includes forming a second line pattern for forming a signal transmission path of the second strip line using a subtractive method or using a semi-additive method in which a metal foil is used.

According to an embodiment of the present invention, flexibility regarding positioning of a strip line in a printed wiring board can be improved, and electrical characteristics of a printed wiring board, including transmission characteristics of a high frequency signal, can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
    a core substrate comprising a plurality of conductor layers and a plurality of intra core substrate insulating layers interposed between the plurality of conductor layers respectively; and
    a laminate formed on a first surface of the core substrate and comprising a plurality of insulating layers and a plurality of conductor layers such that the plurality of conductor layers in the laminate includes a first conductor layer including a first line pattern,
    wherein the laminate includes a first strip line structure comprising the first line pattern, a pair of interlayer insulating layers sandwiching the first line pattern, and a pair of conductor layers sandwiching the pair of interlayer insulating layers, the plurality of conductor layers in the core substrate includes a second conductor layer including a second line pattern such that the core substrate includes a second strip line structure comprising the second line pattern, a pair of the intra core substrate insulating layers sandwiching the second line pattern, and a pair of conductor layers sandwiching the pair of the intra core substrate insulating layers, and the core substrate and the laminate are formed such that a thickness of the pair of the intra core substrate insulating layers is larger than a thickness of the pair of interlayer insulating layers, that a thickness of the second line pattern is larger than a thickness of the first line pattern, and that a line width of the second line pattern is larger than a line width of the first line pattern.

2. The wiring substrate according to claim 1, further comprising:
    a second laminate formed on a second surface of the core substrate on an opposite side with respect to the first surface and comprising a plurality of insulating layers and a plurality of conductor layers,
    wherein each of the intra core substrate insulating layers includes a plurality of via conductors penetrating through the plurality of intra core substrate insulating layers and stacked such that the plurality of via conductors forms a stacked via conductor connecting a conductor layer on the first surface of the core substrate and a conductor layer on the second surface of the core substrate.

3. The wiring substrate according to claim 2, wherein the core substrate and the laminate are formed such that a relative permittivity of the pair of the intra core substrate insulating layers is higher than a relative permittivity of the pair of interlayer insulating layers, and that a dielectric loss tangent of the pair of the intra core substrate insulating layers is higher than a dielectric loss tangent of the pair of interlayer insulating layers.

4. The wiring substrate according to claim 2, wherein the laminate is formed such that surface roughness of the first conductor layer on an opposite side with respect to the core substrate is lower than surface roughness of other conductor layers than the first conductor layer in the laminate on an opposite side with respect to the core substrate.

5. The wiring substrate according to claim 1, wherein the core substrate and the laminate are formed such that a relative permittivity of the pair of the intra core substrate insulating layers is higher than a relative permittivity of the pair of interlayer insulating layers, and that a dielectric loss tangent of the pair of the intra core substrate insulating layers is higher than a dielectric loss tangent of the pair of interlayer insulating layers.

6. The wiring substrate according to claim 1, wherein the laminate is formed such that surface roughness of the first conductor layer on an opposite side with respect to the core substrate is lower than surface roughness of other conductor layers than the first conductor layer in the laminate on an opposite side with respect to the core substrate.

7. The wiring substrate according to claim 1, wherein the core substrate is formed such that surface roughness of the second conductor layer on a first conductor layer side is lower than surface roughness of other conductor layers than the second conductor layer in the core substrate on the first conductor layer side.

8. The wiring substrate according to claim 1, wherein each of the insulating layers in the laminate comprises a resin that does not contain a reinforcing material, and each of the intra core substrate insulating layers comprises a resin including a reinforcing material.

9. The wiring substrate according to claim 1, wherein the laminate is formed such that the first conductor layer does not include a metal foil, and the core substrate is formed such that the second conductor layer includes a metal foil.

10. The wiring substrate according to claim 1, wherein the core substrate and the laminate are formed such that a characteristic impedance of the first strip line structure and a characteristic impedance of the second strip line structure are substantially equal to each other.

11. The wiring substrate according to claim 1, wherein a conductor layer on a core substrate side in the pair of conductor layers forming the first strip line structure is a conductor layer on a first conductor layer side in the pair of conductor layers forming the second strip line structure.

12. The wiring substrate according to claim 1, wherein the core substrate and the laminate are formed such that the first line pattern and the second line pattern are electrically connected to each other.

13. The wiring substrate according to claim 1, further comprising:
    a second laminate formed on a second surface of the core substrate on an opposite side with respect to the first surface and comprising a plurality of insulating layers and a plurality of conductor layers,
    wherein the core substrate and the laminate are formed such that a relative permittivity of the pair of the intra core substrate insulating layers is higher than a relative permittivity of the pair of interlayer insulating layers, and that a dielectric loss tangent of the pair of the intra core substrate insulating layers is higher than a dielectric loss tangent of the pair of interlayer insulating layers.

14. The wiring substrate according to claim 1, further comprising:
    a second laminate formed on a second surface of the core substrate on an opposite side with respect to the first surface and comprising a plurality of insulating layers and a plurality of conductor layers,
    wherein the laminate is formed such that surface roughness of the first conductor layer on an opposite side with respect to the core substrate is lower than surface roughness of other conductor layers than the first conductor layer in the laminate on an opposite side with respect to the core substrate.

15. The wiring substrate according to claim 1, further comprising:
    a second laminate formed on a second surface of the core substrate on an opposite side with respect to the first surface and comprising a plurality of insulating layers and a plurality of conductor layers,
    wherein the core substrate is formed such that surface roughness of the second conductor layer on a first conductor layer side is lower than surface roughness of other conductor layers than the second conductor layer in the core substrate on the first conductor layer side.

16. The wiring substrate according to claim 1, further comprising:
    a second laminate formed on a second surface of the core substrate on an opposite side with respect to the first surface and comprising a plurality of insulating layers and a plurality of conductor layers,
    wherein each of the insulating layers in the laminate comprises a resin that does not contain a reinforcing material, each of the insulating layers in the second laminate comprises a resin that does not contain a reinforcing material, and each of the intra core substrate insulating layers comprises a resin including a reinforcing material.

17. The wiring substrate according to claim 1, further comprising:
    a second laminate formed on a second surface of the core substrate on an opposite side with respect to the first surface and comprising a plurality of insulating layers and a plurality of conductor layers,
    wherein the laminate is formed such that the first conductor layer does not include a metal foil, and the core substrate is formed such that the second conductor layer includes a metal foil.

18. The wiring substrate according to claim 1, further comprising:
    a second laminate formed on a second surface of the core substrate on an opposite side with respect to the first surface and comprising a plurality of insulating layers and a plurality of conductor layers,
    wherein the core substrate and the laminate are formed such that a characteristic impedance of the first strip line structure and a characteristic impedance of the second strip line structure are substantially equal to each other.

19. The wiring substrate according to claim 1, further comprising:
    a second laminate formed on a second surface of the core substrate on an opposite side with respect to the first surface and comprising a plurality of insulating layers and a plurality of conductor layers,
    wherein a conductor layer on a core substrate side in the pair of conductor layers forming the first strip line structure is a conductor layer on a first conductor layer side in the pair of conductor layers forming the second strip line structure.

20. The wiring substrate according to claim 1, further comprising:
    a second laminate formed on a second surface of the core substrate on an opposite side with respect to the first surface and comprising a plurality of insulating layers and a plurality of conductor layers,
    wherein the core substrate and the laminate are formed such that the first line pattern and the second line pattern are electrically connected to each other.

* * * * *